United States Patent [19]

Beauprey

[11] Patent Number: 4,533,830
[45] Date of Patent: Aug. 6, 1985

[54] OPTICAL ENCODER WITH A SHUTTER CLUTCHED FOR DIRECTIONAL MOVEMENT

[75] Inventor: Richard R. Beauprey, Garden Grove, Calif.

[73] Assignee: Disc Instruments, Inc., Costa Mesa, Calif.

[21] Appl. No.: 450,563

[22] Filed: Dec. 16, 1982

[51] Int. Cl.³ ............................................. G01D 5/38
[52] U.S. Cl. .............................. 250/231 SE; 33/1 M; 250/237 R
[58] Field of Search ..................... 250/231 SE, 237 R; 33/1 M, 141 R, 141.5, 142; 324/175; 340/709, 710, 347 P; 273/DIG. 28; 74/471 XY

[56] References Cited

U.S. PATENT DOCUMENTS 3,304,434  2/1967  Koster ........................... 250/231 SE
3,613,090  10/1971 Mason ................................. 33/1 M
3,789,218  1/1974  Blount ........................... 250/231 SE Primary Examiner—Edward P. Westin
Attorney, Agent, or Firm—George F. Bethel; Patience K. Bethel

[57] ABSTRACT

The following specification discloses a Directional Optical Encoder including a track ball. The track ball is supported within a case and moves against two respective shafts for providing positive and negative X and Y movement. The shafts turn circular optical disc encoders wherein a beam of light passes through a slotted disc to be received against a sensing device, such as an optical sensor. The disc is a round disc having slots in order to provide rotationally pulsed outputs to a light sensor on the opposite side of the disc from a light source, such as a light emitting diode (LED). On each shaft, a pendulous shutter is journalled with a fractional or clutched helical spring engagement for providing movement of the shutter in either the plus direction or the minus direction respectively for the X and Y shafts. The shutters provide for shuttering of the light source to one of two light sensors to indicate minus or plus movement, depending upon which particular sensor is being covered. The attendant output from either the minus or plus sensor for each respective X and Y shaft allows for a pulsed output directly to a circuit without further conditioning, modification, or decoding to determine direction.

22 Claims, 9 Drawing Figures

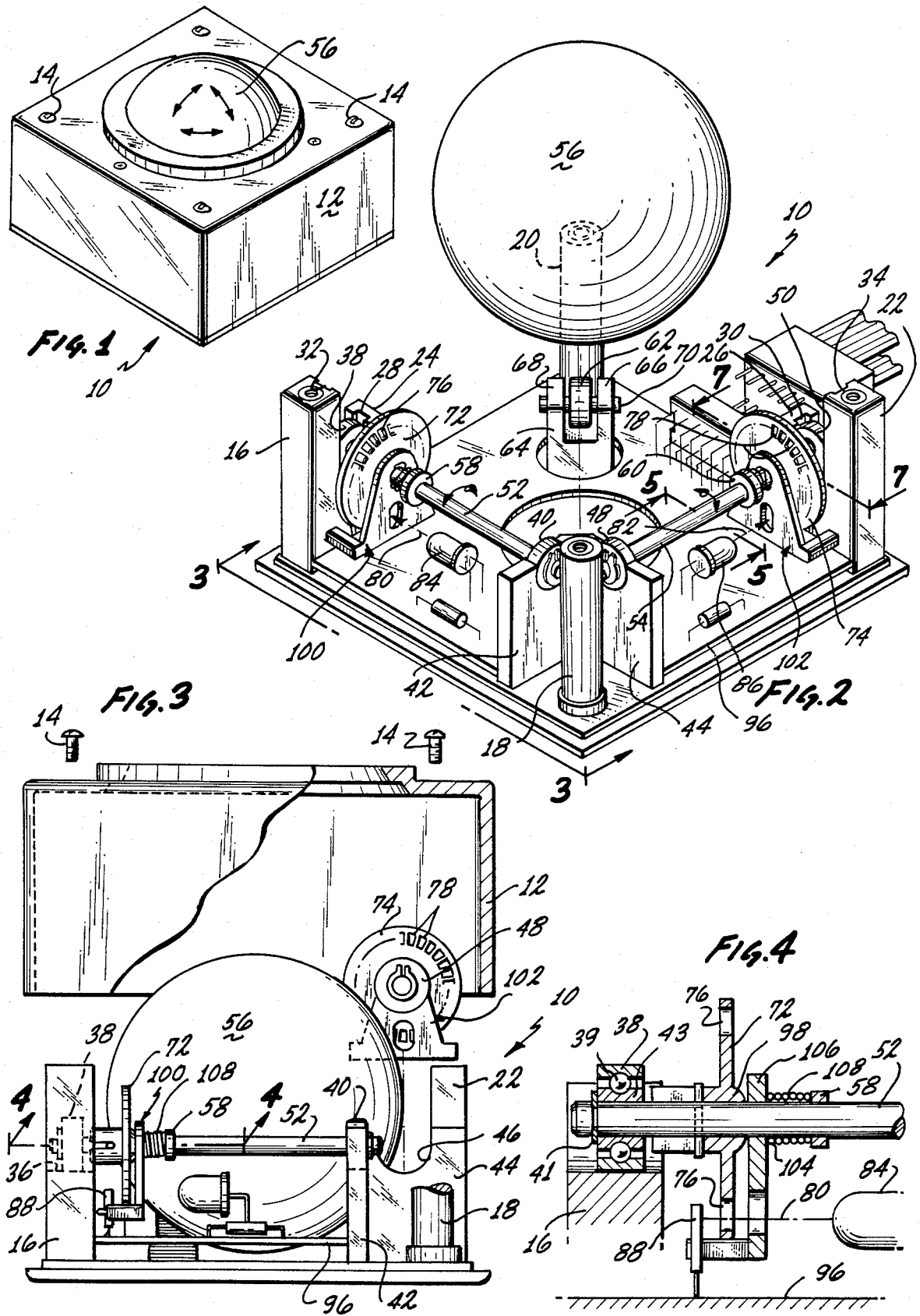

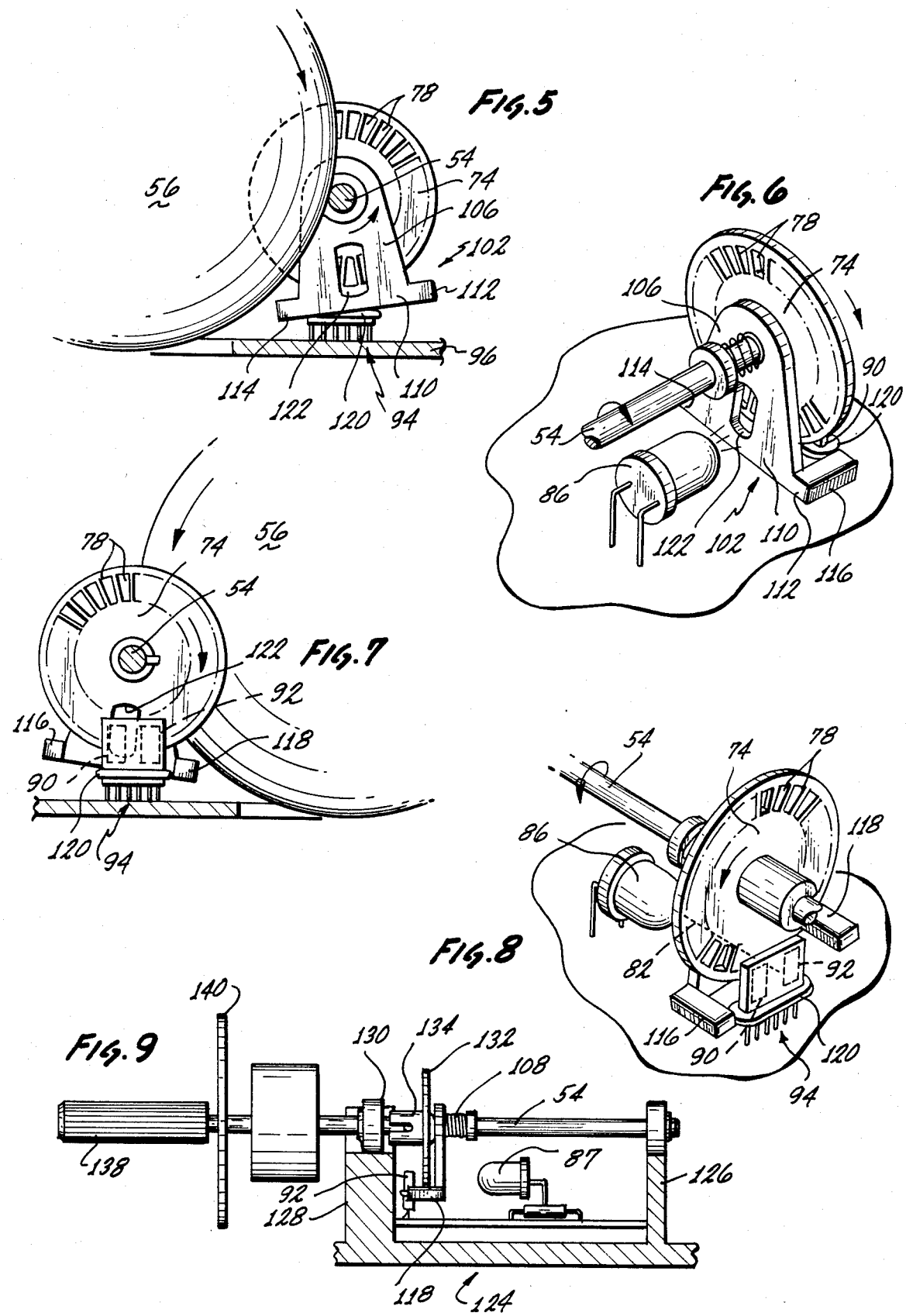

OPTICAL ENCODER WITH A SHUTTER CLUTCHED FOR DIRECTIONAL MOVEMENT

BACKGROUND OF THE INVENTION

1. Field of the Invention

The field of this invention lies within the art of optically encoding through a rotational disc, The rotational disc is provided with radial openings or apertures around its periphery in order to interrupt a light source that is transmitted to a light sensor. The light sensor receives the interrupted light pulses and puts out a pulsed response that is in direct pulsed relationship to the rotation of the disc.

More particularly, the invention involves the utilization of such discs in connected relationship to a track ball, whereby a track ball moves against a shaft to which the disc is connected. The rotation of the track ball in an X and Y direction moves the shaft to effectively cause an output corresponding to the movement of the ball by virtue of the disc rotating in a specific orientation and providing specific pulses to indicate movement of the ball.

2. The Prior Art

The prior art with regard to movement of optical disc encoders in one direction or the other has generally relied upon circuit conditioning components and special masks. Generally, an optical encoder incorporates discs having radial slots or apertures therein. On one side of the disc is a light source, such as light from an incandescent bulb or light emitting diode (LED). On the other side of the disc is a light sensor that receives light that is interrupted by the disc cutting the light. This is due to the spaces between the openings alternately interrupting and allowing the light respectively to pass through the openings of the disc. In this manner, the light source can be interrupted and the light sensor receiving the light can provide for a pulsed output depending upon the number of interruptions which constitute the movement of the disc.

Oftentimes, in order to ascertain the movement in reverse directions of the disc which would constitute movement corresponding to plus or minus directional movement, a mask is utilized. The mask provides segmented output windows or openings with regard to the openings of the disc. Thus, when the disc changes direction, it is provided with either a leading or trailing movement of the light source, depending upon whether the disc is moving in one direction or the other. This movement in one direction or the other causes a respective output which indicates the movement in the minus or plus direction or backwardly and forwardly which corresponds thereto.

The output of the light sensor which corresponds to a trailing or leading output is then conditioned by means of a decoding circuit. The decoding circuit oftentimes must entail the utilization of four discrete chips or integrated circuits. This of course is costly and provides for a degree of difficulty in utilizing the disc or the track ball with regard to its output.

The problem with regard to determining when a disc is turning backwardly or forwardly in a track ball situation or in rotation of a disc by itself devolves down to the point of having to have specialized screens with respect to the disc and/or particular circuitry in order to condition or distinguish and decode the motion of the disc. This involves a significantly more complex series of operations and circuits compared to this invention. In particular, this invention allows for a disc that interferes with a light source to permit pulses to be transmitted to a light sensor which characterizes them as plus or minus, in a backward or forward position. This is provided by means of a unique shutter arrangement.

The foregoing shutter arrangement can be effectively applied to a disc which optically encodes a signal from a light output to a light sensor in a number of different ways. One of the specific configurations herein is one wherein a shutter moves over a light source to either provide a first light sensor with an input from the light source, or which shifts over to another sensor in order to provide an output and a sensing at that particular sensor. by having a light slip clutch engage the shutter so that as the shaft turns, it causes the shutter to move in one direction or the other corresponding to the direction of movement of the shaft. This effectively creates a situation wherein the shutter responds to the movement of the shaft in order to provide for the respective output at the particular sensor which relates to that direction of shaft movement. When the shaft moves in the forward or backward direction which corresponds to a plus or minus direction of the disc, the output thereby corresponds with the respective shaft movement. This is due to the particular channel which corresponds thereto receiving light that has been pulsed by the disc, while the other channel is closed off by the shutter.

The foregoing shutter arrangement can be used for single discs on an optical encoding shaft to provide pulsed outputs corresponding to left and right orientation, positive and negative orientation, or backward and forward orientation, or any other orientation which is derived from respective shaft movement in opposite directions. This can also apply of course to the X and Y component movements of shafts for a track ball. It particularly enhances the output of a track ball in the form of a usable signal that does not have to be conditioned and which does not require separate screening circuitry and discrete orientations with respect to the light pulses.

The invention is a substantial step over the prior art with regard to optical encoders in general, as well as a track ball. The output can be for all uses wherein an optical encoding takes place through a disc in order to provide pulses to a light sensor.

SUMMARY OF THE INVENTION

In summation, this invention comprises an optical encoder having a disc on a shaft which moves in two directions and has an output that corresponds to the respective direction by means of a shutter that is clutched thereto that opens and closes a light source for two respective directionally oriented light sensors to indicate the respective direction in which the shaft is turning.

More particularly, the invention comprises an optical encoder that can be used with a track ball or with other means for turning an apertured disc on a shaft that interferes with light to provide pulses corresponding to the angular orientation of the shaft. The shaft is journalled on a frame within a housing and can rotate in two directions. The shaft can be provided with bearings and driven by a knob in one particular embodiment, or by a track ball in frictional engagement with the shaft. The rotation of the shaft moves the disc for providing a pulsing light source that is received by one of two optical sensors. The light source can be a light emitting diode that is in optical relationship to two light sensors.

The light sensors put out a pulse that corresponds to the number of interferences by the spaces between the openings of the disc. This provides for an appropriate output from the disc to light sensors which indicate not only the number of pulses but the direction of rotation of the shaft.

Directional orientation is provided by a disc which moves in a forward or backward direction and turns a clutched shutter with respect to the movement in that particular direction in which it is moving. The clutched shutter moves to allow the light source to impinge against the respective sensor, that indicates the direction of movement.

The direction of rotation is provided by the shutter in such a manner so as to allow for only the output of that particular channel which corresponds to the direction it is turning. This direction can be such that it corresponds to plus or minus movement of the shaft, a backwardly and forwardly orientation, or any other orientation of opposite directions.

The foregoing feature enables the embodiment of this invention to provide for an optical sensor output which need not be conditioned, or optically screened to indicate the direction of movement of the shaft. As a consequence, it is a step over the prior art with regard to optical disc encoders and allows for the usage of optical encoders on an improved basis.

BRIEF DESCRIPTION OF THE DRAWINGS

The invention will be more clearly understood by reference to the description below taken in conjunction with the accompanying drawings wherein:

FIG. 1 shows a perspective view of a track ball that moves in X and Y directions or components thereof for providing a man to machine interface;

FIG. 2 is a perspective view of the track ball of the invention shown in FIG. 1 with the cover removed and with the ball removed from the base upon which it rests;

FIG. 3 shows a view of the track ball housing and the track ball with a portion of the operative elements in exploded relationship in the direction of lines 3—3 of FIG. 2;

FIG. 4 shows a broken away portion of the mounting of the disc as seen in the direction of lines 4—4 of FIG. 3;

FIG. 5 shows a representation of the movement of the disc and shutter of this invention as seen in the direction of lines 5—5;

FIG. 6 shows a perspective view of the shutter movement and disc moving in the direction opposite from that shown in FIG. 5;

FIG. 7 shows a view of the disc and track ball in the direction of lines 7—7;

FIG. 8 shows a perspective view of the shutter and disc moving in an opposite direction from that shown in FIG. 7; and, FIG. 9 shows a sectional view of an optical encoder with a dial and knob attached thereto having fundamentally the same movements and shutter effect as the prior figures.

DESCRIPTION OF THE PREFERRED EMBODIMENTS

Looking more particularly at FIGS. 1 through 8 it can be seen wherein a track ball housing 10 has been shown in FIG. 1. The track ball housing 10 has a cover 12 thereover and is secured by screws 14. The screws 14 screw the cover 12 down onto a plurality of posts comprising a rectangular post 16 and two round posts 18 and 20.

The round posts 18 and 20 are oriented with a second rectangular post 22 which serves to square up the cover 12 in its overlying relationship to the entire housing.

Each of the rectangular posts 16 and 22 incorporate a second upright portion 24 and 26 which are provided with slots 28 and 30. These slots 28 and 30 are within the minor upright portion and are opposite slots 32 and 34. The slots 32 and 34 and slots 28 and 30 terminate in a curved base which can be seen in FIG. 3, namely base portion 36 which is an arcuate semi-circularly round portion that receives a bearing 38.

A second bearing 40 distal to the first bearing 38 is supported in a curved portion of a bearing post 42. A second bearing post 44 is seen having its curved portion 46 or curved seat into which a shaft or bearings for a second shaft, namely bearing 48 is seated in the base thereof. Bearing 48 is distal from another bearing 50 seated within the bearing post slots 30 and 34.

The foregoing bearings, slots and posts serve to support a pair of shafts 52 and 54. The shafts 52 and 54 are for purposes of providing X and Y outputs with regard to the movement of a ball 56. The ball 56 rests against the respective shafts 52 and 54, which provide a direct drive from the ball 56 in order to move the shafts 52 and 54. Any drive from the ball 56 to the respective shafts 52 and 54 can be utilized in order to turn the shafts in the desired manner to effectuate the optical encoding called for.

The ball is further supported by means of an idler roller 62. The idler roller 62 is supported by means of a post 64 on the uprights 66 and 68 that provide for support of an axle 70 on which the idler 62 can rotate. The idler 62 can be in the form of any roller or other rotational device supported on the axle 70 or it can be in the form of any other bearing means for supporting the ball 56 in a manner so that it can rotate. In effect, the idler 62 can be substituted by means of a roller of any configuration to receive the ball 56 or it can be in the form of a bearing surface or rotational ball against which the ball 56 can rest. One way or the other, the ball 56 must have free movement so as to allow for X and Y movement and components thereof in order to drive the shafts 52 and 54.

The shafts 52 and 54 in their supported relationship in their bearings, such as bearings 48 and 40 for shaft 52, allow for the shafts to turn a pair of discs 72 and 74. Discs 72 and 74 are the optical encoding discs that provide the pulsing of the light. In particular, light is pulsed through the optical encoding discs through a plurality of openings or apertures 76 and 78.

The spacers or webs between the openings of apertures 76 and 78 allow for an interruption of light from a beam, such as the beams 80 and 82 being emitted from a light source 84 and 86. The light sources 84 and 86 can be light emitting diodes or other types of lights, including incandescent lights. However it has been found that a light emitting diode (LED) is the most beneficial for providing the output of light necessary to allow this invention to function.

The LED providing the beam 80 shines through to a pair of light sensors 88 and a second one that is not shown in direct juxtaposition to it.

LED 86 shines through to light sensors 90 and 92 shown in FIGS. 7 and 8. These light sensors 90 and 92 respectively receive a beam of light that shines thereon to not only indicate the number of pulses equivalent to the number of openings or apertures 78, but also encode the direction of the shaft, in this instance shaft 60.

The light sensors 90 and 92 are duplicated with respect to the optical encoder 72 as seen with respect to light sensor 88 and a second light sensor that is hidden behind it in the view of FIG. 3.

The light sensors 90 and 92 are connected by terminals 94 to a circuitboard 96. The circuitboard 96 is such that it provides the various functioning electronic components for the device that will be set forth hereinafter.

Looking more particularly at the details of FIG. 4 in order to understand the mechanical components, it can be seen that the bearing 38 is shown in the form of a ball bearing having balls 39. In addition thereto, a clamp ring 41 is shown holding the ballbearing 38 in place. The clamp ring 41 can be substituted by heat setting or holding the bearing 38 in any manner on the shaft 52. In other words, it is not necessary to hold the shaft 52 in the bearing 38 by any specific means, so long as the inner race 43 of the bearing engages the shaft 52.

The disc 72 rotates on the shaft on a fixed basis and is engaged by means of a hub 98 of the disc 72 being attached to the shaft 52.

A cross sectionally L-shaped shutter 100 is shown in part overlying in juxtaposition the disc 72. A second L-shaped shutter is shown overlying the disc 74, namely L-shaped shutter 102. The two respective L-shaped shutters 100 and 102 provide for the operational features of determining the backward and forward movement of the discs 72 and 74. In particular, the two respective shutters 100 and 102 are pivotally attached to the shaft 52 through an opening 104 passing through the upright 106 of the shutter. The opening 104 allows for pivotal orientation of the shutter around the axis of the shafts 52 and 54 so that they can pivotally swing backwardly and forwardly on the shaft.

A spring 108 in the form of a coil spring is shown pressing against the upright 106 of the shutters 100 and 102. The spring 108 acts as a clutching spring to engage the upright 106 of shutters 100 and 102 against the hubs 98 of the discs 72 and 74. The hubs 98 of the discs provide for the bearing surface of the spring pushing the shutter 100 thereagainst on one side, while the washer 58 on the other side provides for holding the spring. As will be recalled, the washer 58 is the same as washer 60 and secures the spring 108 in place. However, any means to hold the spring 108 such as an expanded shaft, crimp, or lateral opening in the shaft can be utilized.

Looking in more detail at FIGS. 5 and 6, it can be seen that when the ball 56 of FIG. 5 is rotating in a clockwise direction, the shaft 54 rotates in a counter-clockwise direction. When the ball 56 is rotating in the opposite direction as in FIG. 6, it can been seen that the shaft is rotating in a clockwise direction based upon the counter-clockwise rotation of the ball 56.

FIG. 6 shows the shaft 54 moving in a clockwise direction due to the fact that the ball 56 is rotating in the opposite direction, namely in a counter-clockwise direction. The showing of FIGS. 5 and 6 is such that the shutter is respectively biased and moves in the opposite direction from which it was previously oriented when the shaft is moved oppositely from the direction it initially moved in.

Looking more particularly at the shutter 102 it can be seen wherein the upright 106 of the shutter terminates in a belled-out bottom 110. The belled-out bottom has two legs which form the cross portion of the extension of the L-shape of the shutter. In particular, extensions 112 and 114 which form the cross members of the bottom of the L of the cross section or shape of the shutter terminate in respective stops 116 and 118. The stops 116 and 118 are such that they are cushioned or damped from movement by the upright portion of the terminals 94 which support the light sensors 90 and 92.

In order to provide cushioning, an elastomeric elongated doughnut 120 forms a bumper and surrounds the light sensors 90 and 92. The doughnut or bumper 120 is such that it provides for a cushioning as the arms or stops 116 and 118 move backwardly and forwardly. The end result is such that the shutters 100 and 102 do not spin in frictional engagement by the spring clutching them to the shafts 52 and 54 in coordination with the movement of the shaft. To the contrary, the shutters stop at a pre-established point.

The theory of operation for the directional electrical output movement shaft is the shaft movement shutters one of two of the light sensors 90 and 92. Thus, the light 86 which casts its beam 82 through the openings 78 or apertures, casts a beam either on light sensor 90 or 92 depending upon rotation of the shaft 54. This can be more readily seen in the various showings of FIGS. 5 through 8.

In particular, it can be seen in FIG. 5 that the shutter 102 has moved in a direction whereby the clutch or frictional engagement has caused the shutter to swing the shutter 102 to the right. When the shaft is reversed in the clockwise direction in FIG. 6, the shutter 102 has moved to the left in the drawing. In this manner, a major aperture of the shutters 100 and 102, namely aperture 122, allows light to pass from the light source 86 to a respective light sensor 90 or 92 which determines the direction of movement of the shaft.

This can be seen in some measure in FIG. 7 which shows the disc 74 and shaft 54 moving in a clockwise direction. As can be seen, the major aperture 122 is directing the source of light 86 against the light sensor 90. Thus, the light sensor 90 with its respective terminals of the terminals 94 puts out a signal of pulses from the light sensor on those terminals which correspond with the direction of movement. As previously stated, this can be either a minus or plus X or Y direction, or for that matter, any particular movement that is associated with the relative placement of the movement of the disc 74 in its backward or forward rotational movement.

Looking more at FIG. 8 it can be seen wherein the shaft 54 and disc 74 are moving in the counter-clockwise direction. This causes the shutter to move to the right, thereby causing the light beam 82 to be transmitted through the major aperture 122 of the disc 74 and impinge against light sensor 92. This movement is opposite from the movement of FIG. 7.

Looking more particularly at FIG. 9, it can be seen wherein a frame 124 is shown having a pair of uprights 126 and 128. The uprights 126 and 128 support a bearing 130 with a disc 132 and a hub 134 upon which it is mounted.

A shutter, like shutters 72 and 74 is shown, namely shutter 136. The disc 132 has the analogous apertures 78 of the prior discs and interrupts a light source from a light 87. The light 87 casts a beam through the main aperture 122 of shutter 136 analogous to the prior main aperture. The shutter 136 incorporates analogous appendages or stops 116 and 118 which is shown as stop 118 in the direction of FIG. 9. The light sensor 92 is also shown with the light sensor 90 opposite therefrom and is hidden from view. A shaft 54 is utilized as in the prior embodiments in order to support the disc 74. Also, the spring as previously mentioned, namely spring 108 is utilized.

This particular embodiment differs from the prior embodiment by virtue of the fact that it provides for a dial that can be turned by means of a knob 138 for purposes of turning the disc 132 to the left or to the right, or counter-clockwise, or clockwise which corresponds to a particular direction of plus or minus movement. The dial 140 turns the disc 132, thereby providing the positive or negative output from light sensor 90 and 92 depending upon the direction of movement as indicated in the prior embodiment. In other words, the showing of FIG. 9 shows an optical encoder that utilizes a disc having the shutter 136 analogous the shutter 102 and provides for the left or right or positive and negative movement being indicated for an output through the terminals to indicate the number of pulses in either a positive or negative direction.

In summation, the invention incorporates a shutter to provide for a light output to be pulsed in either a positive or negative direction by means of positive or negative light sensors. The positive or negative direction is only to be considered relative with respect to opposite directions so that positive or negative direction is a convention that can be up, down, forwardly, backwardly or any opposite directions that correspond to the movement of a knob 138 or the track ball 56. Thus, the optical output of the pulses by the discs 72, 74 or 132 in their turning relationship create a situation wherein the pulses are read by one of two sensors in one direction or the other and the output at the terminals 94 corresponds to those particular directions. This eliminates the requirement of having a screen placed between the disc and the optical sensor and conditioning circuitry and decoding circuitry to decode which direction the discs 72, 132 or 74 are moving, which corresponds to shaft movement.

As a consequence of the foregoing, this invention is a substantial step over the prior art and should be read broadly in light of the prior art pertaining to optical encoding disc movement and distinguishing the direction thereof.

It is claimed:

1. The improvement in an optical disc encoder of the type having a disc, with apertures therein, which interrupts a light source in a pulsed manner as the disc turns in order to provide for pulsed light reception by light sensors to indicate the radial movement of the disc, wherein the improvement comprises:
   at least two light sensors on one side of the disc having an optical path in relationship to the light source that is interrupted by said disc; and,
   shutter means clutched for directional movement with respect to said disc that close off one light sensor when the disc moves in one direction and closes off a second light sensor when the disc moves in the other direction in order to accommodate the output on either light sensor corresponding to the direction of rotational movement of said disc.

2. The optical encoder as claimed in claim 1 wherein: said shutter means is clutched for movement by means of a spring bias.

3. The optical encoder as claimed in claim 1 wherein: said disc is connected to a rotating shaft; and, said shutter means is supported on said shaft and clutched for rotational movement on said shaft when said shaft turns in one direction or the other in order to move said shutter in a direction corresponding to movement thereby causing light to be imparted to a light sensor that corresponds to the direction of movement.

4. The optical encoder as claimed in claim 3 wherein: said shutter means has an aperture which allows the light from a light source to pass therethrough for impingement against one light sensor or the other, depending upon the direction of movement of the disc.

5. The optical encoder as claimed in claim 4 further comprising:
   stops for prevenging movement of said shutter means beyond a specific radial orientation when it is clutched for movement in a particular direction.

6. The optical encoder as claimed in claim 5 in combination with a track ball that is supported to provide for movement of the shaft upon which the disc of the optical encoding disc is supported.

7. The optical encoder as claimed in claim 5 wherein: said disc is mounted for rotation on a shaft to provide dial indication means and further comprising a dial in operative relationship to said shaft for orienting said shaft with respect to said dial.

8. An optical encoder wherein pulses of light are sensed by a light sensor to emit electrical signals corresponding to the number of pulses comprising:
   a base;
   means for supporting a shaft on said base;
   a disc supported on said shaft having a plurality of openings for allowing light to pass therethrough;
   a source of light for causing light to pass through the openings of said disc as it rotates, thereby interrupting said light as the disc rotates;
   at least two light sensors on the opposite side of said disc from where said light source is, connected to a circuit for providing an output of light pulses corresponding to the interruption of said light by the disc; and,
   shutter means connected to clutch means for directional movement in correspondence with said disc attached to said shaft for movement by said shaft to cover one or the other of said light sensors to provide a pulsed output of said light that corresponds to the direction of movement depending upon said shutter means orientation over one of the two light sensors.

9. The optical encoder as claimed in claim 8 comprising:
   said shutter means having a portion with an opening therethrough which when rotated with said shaft covers the light path to one of the two optical light sensors; and further comprising:
   a stop means on said shutter means to prevent rotation beyond a given arcuate angle.

10. The optical encoder as claimed in claim 9 wherein said clutch means comprises:
    spring biasing means engaging said shutter means in conjunction with said shaft so that when said shaft turns, it cooperatively turns said shutter means.

11. The optical encoder as claimed in claim 10 in cooperation with a dial means for indicating to a user the position of said disc.

12. The optical encoder as claimed in claim 10 further comprising:

a second optical encoder including said shutter means, shaft, disc and other support means in combination therewith and mounted on a frame;

a track ball;

means for mounting said track ball on said frame; and, means for engaging said track ball with said shafts for translation of movement from said track ball to said shafts so that as said track ball is moved it will accordingly move the shafts of said optical encoder.

13. An optical encoder for providing a user with the ability to provide optically encoded signals with regard to the radial movement of a knob to create electrical signals corresponding to said radial movement comprising:

a disc having a plurality of openings or apertures surrounding a circumferential portion thereof;

means for rotationally supporting said disc;

means connected to said disc for turning said disc by an operator to a respective location for providing a given pulsed output of signals;

at least two light sensors on one side of said disc;

light means on the opposite side of said disc from said light sensors for passing light through said disc to provide pulsed interruptions by said disc apertures corresponding to radial changes of said disc; and, shutter means supported in connected relationship to said disc having clutch means for engaging said disc for covering one of the two light sensors with respect to movement of said disc.

14. The optical encoder as claimed in claim 13 wherein:

said shutter is pendulously supported from the support means for said disc and has at least one major opening within it in order to allow the passage of light to one of said optical sensors; and, spring biasing means in the form of a coiled spring on said disc support means for clutching said shutter for angular movement corresponding to the directional movement of said disc.

15. The optical encoder as claimed in claim 14 further comprising:

stop means for stopping the rotation of said shutter beyond a certain radial point with respect to the movement of said disc.

16. A track ball for providing a user with machine interface movement between said ball and another device whereby the output from said track ball corresponds to X and Y movement pulses from said track ball wherein the improvement comprises:

a pair of optical encoding discs having radially spaced apertures around a portion of the circumference thereof;

means for supporting said optical encoding discs;

at least two light sensors on one side of each of said optical encoding discs;

a light source on the other side of each of said optical encoding discs from said light sensors;

means for engaging said track ball with said optical encoding discs for rotating them in corresponding rotational relationship to the movement of said track ball; and, a pendulously oriented shutter clutched for directional movement and supported on the means for supporting said optical encoding discs for pivotal movement on said support means so that as said discs move causing the clutching of said shutter, said shutter will move to a particular stop point for shuttering one of said two light sensors with respect to opposite movement of said optical encoding discs so that an output can be provided that corresponds to the direction of movement of said optical encoding disc which corresponds to the movement of said track ball.

17. The track ball optical encoding system as claimed in claim 16 further comprising:

clutch means for causing said shutter to move in correspondence with said optical encoding discs.

18. The track ball optical encoding system as claimed in claim 17 further comprising:

stop means on said shutter for preventing said shutter from rotating beyond a particular point with respect to said optical encoding discs.

19. The track ball optical encoding system as claimed in claim 18 further comprising:

spring biasing means in the form of a coil spring comprising said clutch means against the support means for said optical encoding discs.

20. The track ball optical encoding system as claimed in claim 16 further comprising:

means for supporting said track ball in the form of circular contact means on said means for supporting said discs; and, at least one other support means supporting said track ball.

21. The track ball optical encoding system as claimed in claim 20 wherein said other support means comprises:

a rotatable idler bearing engaging said track ball.

22. The track ball optical encoding system as claimed in claim 21 further comprising:

terminals in orientation with said light sensors for providing actual pulsed signals on each of said terminals corresponding to the direction of movement of said track ball in the X and Y components for each respective optical encoding disc.

* * * * *